United States Patent

Cheung et al.

[11] Patent Number: 5,891,784
[45] Date of Patent: Apr. 6, 1999

[54] TRANSISTOR FABRICATION METHOD

[75] Inventors: Wan Yee Cheung, Bridgewater, N.J.; Sailesh Chittipeddi, Emmaus, Pa.; Chong-Cheng Fu, Austin, Tex.; Taeho Kook, Lower Macungie Township, Pa.; Avinoam Kornblit, Highland Park, N.J.; Steven Alan Lytle, Orlando, Fla.; Kurt George Steiner, Orlando, Fla.; Tungsheng Yang, Orlando, Fla.

[73] Assignee: Lucent Technologies, Inc., Murray Hill, N.J.

[21] Appl. No.: 430,084

[22] Filed: Apr. 27, 1995

Related U.S. Application Data

[63] Continuation-in-part of Ser. No. 148,751, Nov. 5, 1993, abandoned.

[51] Int. Cl.⁶ ............... H01L 21/331; H01L 21/336
[52] U.S. Cl. ............... 438/303; 438/305; 438/592; 438/790; 438/783; 438/952
[58] Field of Search ............... 437/40–41, 44, 437/200; 438/585, 592, 301, 305, 307, 952, 303, 783, 790

[56] References Cited

U.S. PATENT DOCUMENTS

| | | | |
|---|---|---|---|
| 5,139,974 | 8/1992 | Sandhu et al. | 437/228 |
| 5,185,279 | 2/1993 | Ushiku . | |
| 5,302,538 | 4/1994 | Ishikawa et al. | 437/40 |
| 5,346,867 | 9/1994 | Doan et al. | 156/657 |
| 5,352,631 | 10/1994 | Sitaram et al. | 437/200 |
| 5,354,387 | 10/1994 | Lee et al. . | |
| 5,395,780 | 3/1995 | Hwang . | |
| 5,441,914 | 8/1995 | Taft et al. | 437/189 |
| 5,445,987 | 8/1995 | Kuroda et al. | 437/43 |
| 5,482,894 | 1/1996 | Havemann | 437/195 |
| 5,604,157 | 2/1997 | Dai et al. | 437/200 |
| 5,747,388 | 5/1998 | Kusters et al. | 438/723 |

Primary Examiner—Richard A. Booth

[57] ABSTRACT

A method of forming low stack height transistors having controllable linewidth in an integrated circuit without channeling is disclosed. A disposable hardmask of doped glass is utilized to define the gate and subsequently protect the gate (and the underlying substrate) during ion implantation which forms the source and drains. An anti-reflective coating helps protect against reflective gate notching. A variety of silicided and non-silicided) structures may be formed.

6 Claims, 9 Drawing Sheets

5,891,784

TRANSISTOR FABRICATION METHOD

This is a continuation in part of U.S. application Ser. No. 08/148,751 filed Nov. 5, 1993 and now abandoned.

TECHNICAL FIELD

This invention relates to semiconductor integrated circuits and to methods for their fabrication.

BACKGROUND OF THE INVENTION

Semiconductor integrated circuits are often fabricated by creating raised topographic features upon a substrate. Then a dopant species is introduced into the substrate with the raised topographic features serving to mask a portion of the substrate. For example, in the fabrication of semiconductor integrated circuits using field effect transistors (FETS), a gate stack (typically including a gate oxide with an overlying body of polysilicon) is formed upon a silicon substrate. Then a dopant species is introduced into a silicon substrate by diffusion or ion implantation to create the source and drain regions on both sides of the gate stack. As the dopant species is introduced, the gate stack serves as a self-aligned mask shielding the channel under the gate from the dopant species.

Of course, during the above-described dopant introduction, the gate stack is subjected to the same environment as the to-be-formed source and drain regions are subjected. For example, if ion implantation techniques are employed to create the source and drain, the gate stack is exposed to ion implantation of the same dopant species as the to-be-formed source and drain regions.

In the past, exposure of the gate stack to ion implantation species has not generally created a problem because the implanted species have been completely absorbed by the gate polysilicon. However, as integrated circuit geometries have continued to shrink, the thickness of gate stacks has also shrunk. If the thickness of the gate is too low relative to the implant dose energy, the implanted species may penetrate through the gate.

Penetration of the implanted species through the gate is often termed "channeling." If the energy of the implanted species is great enough and the polysilicon grains are oriented with the direction of the implant species, then the range of implanted species becomes greater than the thickness of the gate stack, and the implanted species may arrive at the gate oxide-silicon interface with enough energy to penetrate into or perhaps through the gate oxide. Thus, channeling depends upon the size and orientation of the polysilicon, as well as the energy of the implant species. A single large grain, if oriented parallel to the implant direction, can permit channeling.

When channeling occurs, the silicon surface beneath the gate may be inverted, leading to transistor leakage and/or shifts in the threshold voltage. Another adverse affect of channeling is gate oxide degradation. In addition, channeling may cause flat band voltage shifts in polysilicon capacitors in the same integrated circuit. Heretofore, the channeling problem has not posed a serious obstacle to integrated circuit designers because gate stacks in previous generation integrated circuits have been thick enough to prevent channeling.

SUMMARY OF THE INVENTION

These problems are alleviated by the present invention which illustratively includes:

forming a dielectric layer upon a substrate;

forming a conductive layer upon the dielectric layer;

forming a material layer overlying the conductive layer;

forming an anti-reflective coating upon said material layer;

forming a patterned resist upon said anti-reflective coating etching said anti-reflective coating;

at least partially etching the material layer to thereby form a raised feature;

removing the resist;

using the raised feature as a mask, anisotropically etching said conductive layer, thereby forming a gate;

forming a source and drain region; and removing the mask.

DETAILED DESCRIPTION

Figure 1:
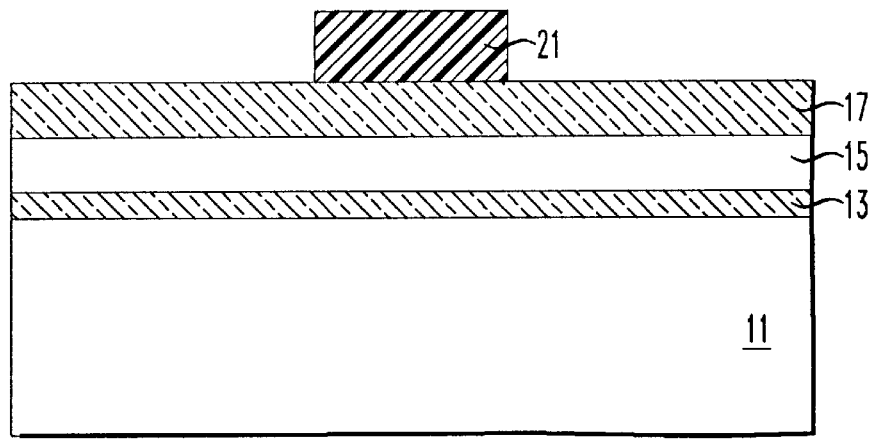
FIGS. 1–26 are cross-sectional views presenting illustrative embodiments of the present invention.

In FIG. 1, reference numeral 11 denotes a substrate which may, typically, be silicon, epitaxial silicon, polysilicon, amorphous silicon, or doped silicon. In general, the term substrate refers to a body having a surface upon which other materials may be formed.

Reference numeral 13 denotes an oxide layer which may typically have a thickness between 30 Å and 300 Å.

Reference numeral 15 denotes a polysilicon layer which may or may not be doped. The thickness of polysilicon layer 15 is typically desirably between 200 Å and 5000 Å.

Reference numeral 17 denotes a doped silicon dioxide layer. The thickness of layer 17 is typically desirably between 100 Å and 4000 Å.

Desirably, layer 17 may be formed as a single layer or sometimes as a bilayer. For example, layer 17 may be formed from BPSG having approximately 4% boron and 4% phosphorus by weight. Alternatively, layer 17 may be formed from BPSG, having approximately 1% boron and 5% phosphorus. Furthermore, layer 17 may be formed from PSG having a doping of approximately 2% or greater pphosphorus. Other suitable materials for layer 17 are BPSG, plasma enhanced doped or undoped oxide, spin-on glass, silicon nitride (LPCVD or plasma enhanced CVD), or silicon oxynitride. Generally, layer 17 may be a doped silicon dioxide formed from a variety of precursors such as TEOS, silane, DADBS, etc.

Layer 17 may be formed as a bilayer, as mentioned above. For example, layer 17 may be one of the forms of doped silicon oxide mentioned above formed over an undoped silicon oxide. Alternatively, layer 17 may be a single silicon oxide layer whose doping gradually increases from bottom to top. Layer 17 may also be a layer of silicon nitride with an underlying layer of silicon oxide which serves as an etch stop during subsequent etching steps.

Layer 21 is a patterned photoresist layer.

Figure 2:
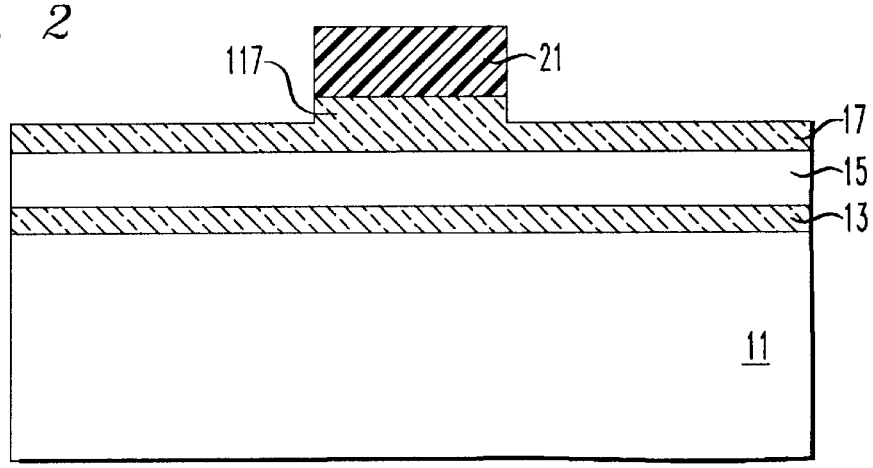

Turning to FIG. 2, a gate stack is defined, preferably by utilizing patterned photoresist 21 to either partially or completely etch through layer 17. If layer 17 is a bilayer, only the upper layer may only be etched while photoresist 21 is in place. If layer 17 is a single layer, it may be etched completely.

Figure 3:
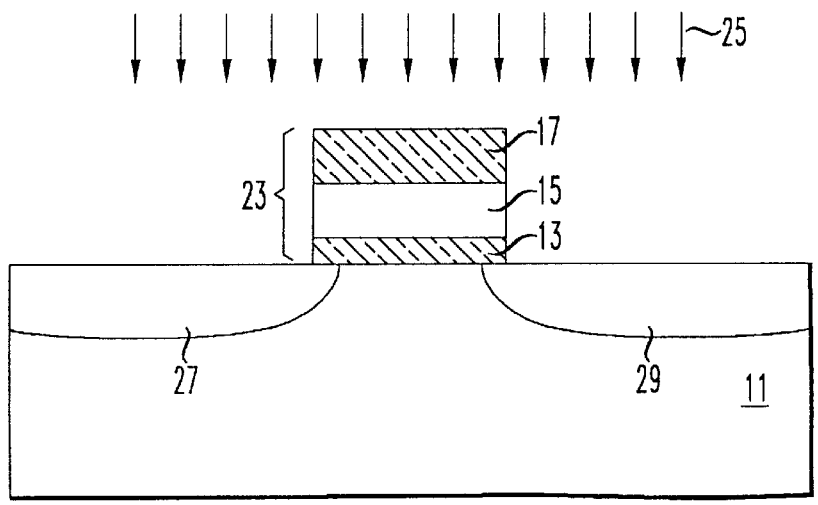

In any case, after layer 17 has been subjected to the etch process for an appropriate period of time, resist 21 may be removed and the portion 117 of layer 17 beneath resist 21 may be used as a mask for subsequent etching which ultimately defines gate 23 shown in FIG. 3. Alternatively, resist 21 may be permitted to remain in place during the entire etching process. (Removal of resist 21 often provides superior linewidth control.)

In FIG. 3, after gate 23 is defined, implantation species 25 is directed at gate 23 and substrate 11, forming shallow junctions 27 and 29. (Definition of gate 23 is usually accomplished by dry etching of layers 15 and 17 followed by wet etching of layer 13.) Layer 17 helps to prevent channeling through gate stack 23.

Figure 4:
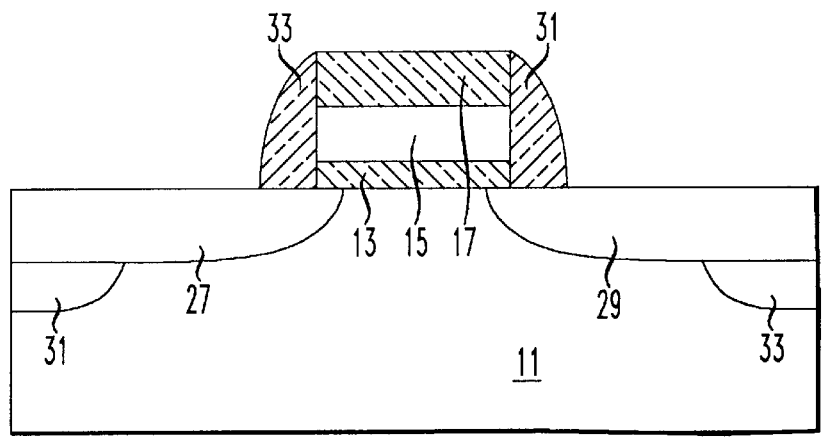

Turning to FIG. 4, spacers 31 and 33 are formed, preferably, from undoped silicon dioxide by depositing and then anisotropically etching a layer of silicon dioxide. Spacers 31 and 33 abut gate stack 23. Implantation species 35 is directed at gate stack 23 and substrate 11, forming deep junctions 31 and 33.

Figure 5:
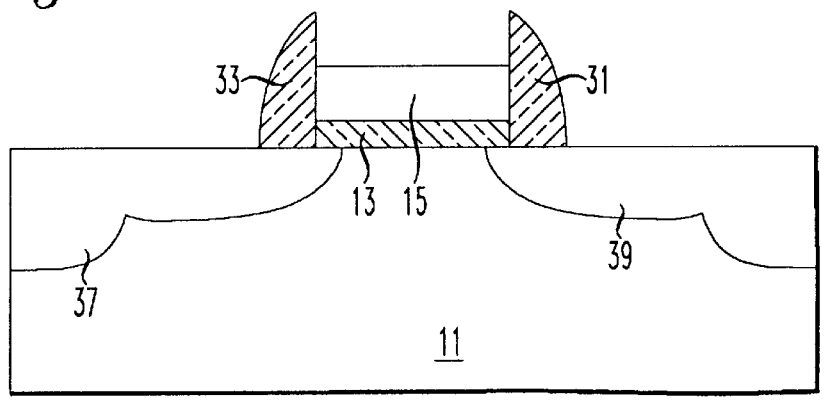

Turning to FIG. 5, annealing steps, understood by those skilled in the art, are performed to drive in the combined junctions which, for convenience, are now designated by reference numerals 37 and 39. Next, layer 17 is removed by etching processes with high selectivity to silicon dioxide.

Wet etching formulas based upon HF tend to attack doped glass more quickly than undoped glass. However, such processes nevertheless do etch undoped glass and may cause undesirable reduction of the bird's beak, leading to transistor leakage.

Layer 17 may also be removed utilizing $NH_4OH/H_2O_2$. The use of $NH_4OH/H_2O_2$ is termed an ammonium peroxide (AP) clean. The preferred formula is eight parts $H_2O$, two parts $H_2O_2$ (30% concentrated), and one part concentrated $NH_4OH$ at approximately 80° C. Dry etch recipes may also be employed to remove layer 17.

If silicon nitride is used as layer 17, it can be removed in hot phosphoric acid or in plasma using chemistries selective to oxide. In such an event a protective oxide layer may be previously formed on top of layer 15 to protect it from an attack by the plasma. Alternately, plasmaless dry etching using gas phase fluorides such as chlorine trifluoride, bromine trifluoride, iodide pentafluoride and xenon difluoride can be used.

If silicide is not desired upon gate stack 23 or over junctions 37 and 39, conventional processing may begin at this point. For example, a dielectric may be blanket deposited, windows opened to expose junctions 37 and 39, and first level metallization formed.

Layer 17 has prevented channeling through the gate which consists of layers 13 and 15. Furthermore, layer 17 has been removed without risk of damage to the gate, the substrate, or the field oxide.

If silicide is desired, either upon gate stack 23 or over junctions 37 and 39, a variety of processing options are available. The next few paragraphs will explain how silicide may be formed upon the gate 23 and junctions 37 and 39.

Figure 6:
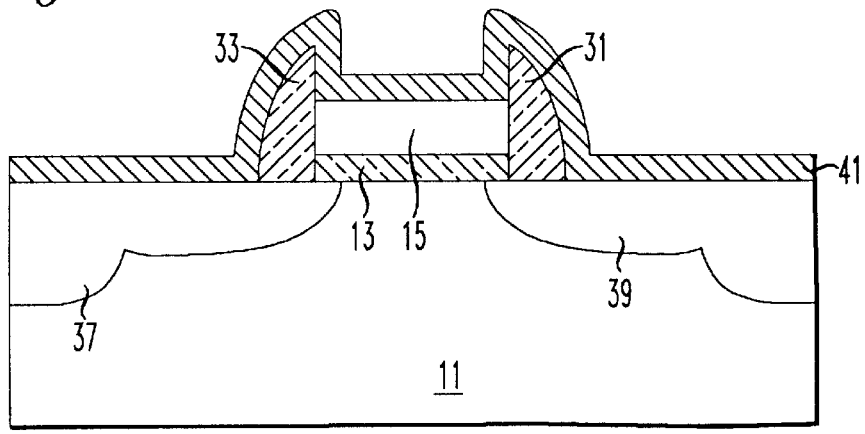

Turning to FIG. 6, layer 41 of refractory metal is blanket deposited.

Figure 7:
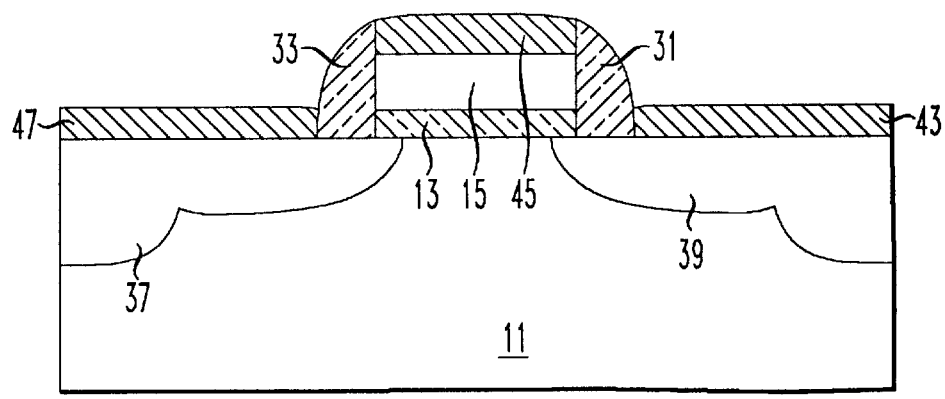

FIG. 7 illustrates that silicide regions 43, 45 and 47 have been formed after heat treatments known to those skilled in the art. No silicide forms upon oxide spacers 31 and 33. Unreacted refractory metal remaining upon spacers 33 and 31 may be removed by methods known to those skilled in the art.

Figure 8:
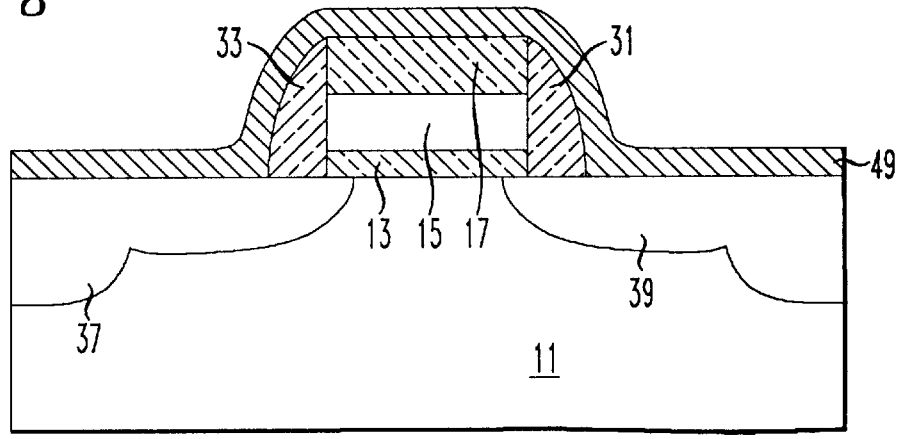

Alternatively, if it is desired to form a silicide over junctions 37 and 39 without forming a silicide over gate stack 23, a slightly different process may be employed. Starting from FIG. 3, a drive in step is performed to create regions 37 and 39 shown in FIG. 8. However, layer 17 is not removed. After regions 37 and 39 are formed, layer 49 of refractory metal, for example, titanium or cobalt, is deposited.

Figure 9:
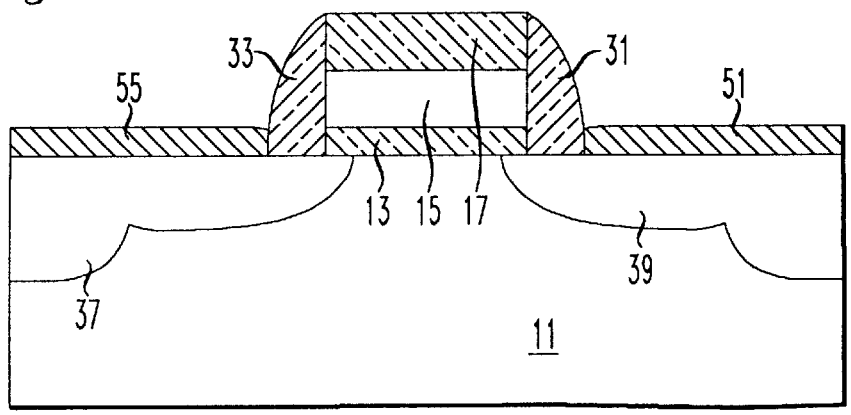

After appropriate heat treatment, silicide regions 51 and 55 in FIG. 9 are formed over junctions 37 and 39. No silicide is formed upon gate stack 23, because refractory metal 49 does not react to form a silicide with layer 17. Unreacted refractory metal is removed by methods known to those skilled in the art. Subsequently, layer 17 can be removed to lower the stack height.

Figure 10:
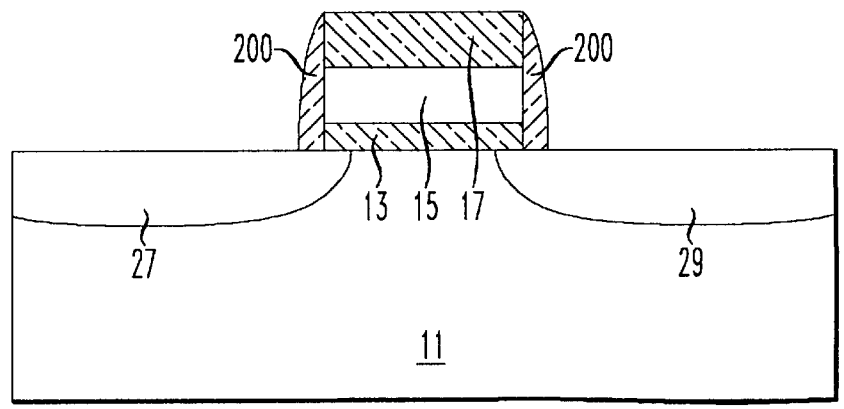

Should it be desired to form a silicided gate without silicided source or drain, the structure of FIG. 10 (which is similar to FIG. 3) is created by the processes described above in the creation of FIGS. 1, 2 and 3. In FIG. 10, oxide layer 17 is positioned above conductor 15 and gate oxide 13. Source and drain regions are denoted by reference numerals 27 and 29, respectively. Spacers 200 are formed.

Figure 11:
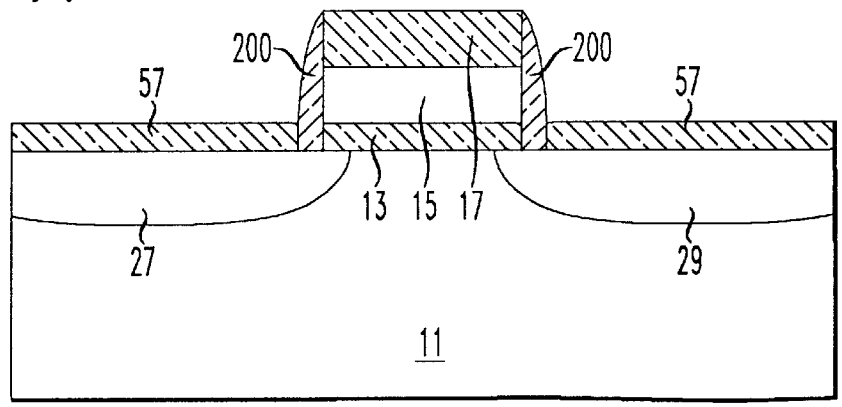

Next, turning to FIG. 11, the structure of FIG. 10 is subjected to an oxidizing ambient and thermal oxide 57 is grown upon substrate 11, covering source and drain regions 27 and 29.

Figure 12:
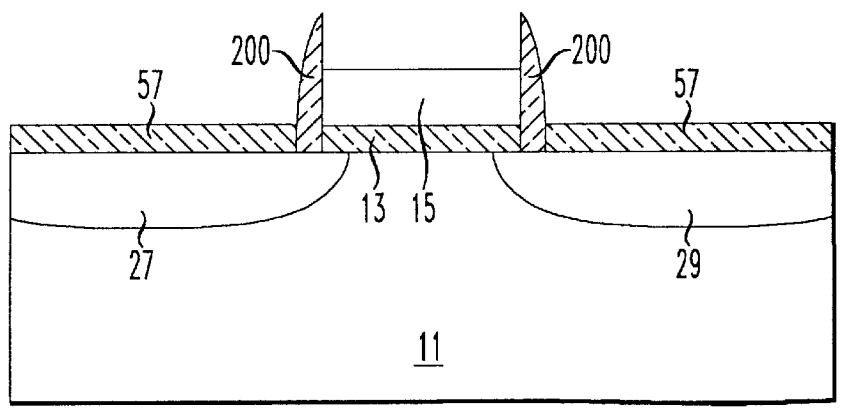

In FIG. 12, oxide 17 is removed by techniques described above. Because oxide 17 is doped, it may be singly removed without a risk of damaging thermal oxide 57.

Figure 13:
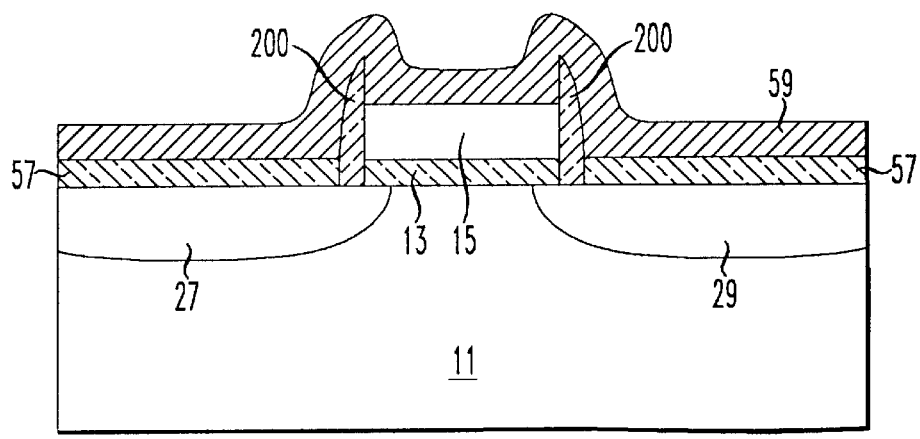
Figure 14:
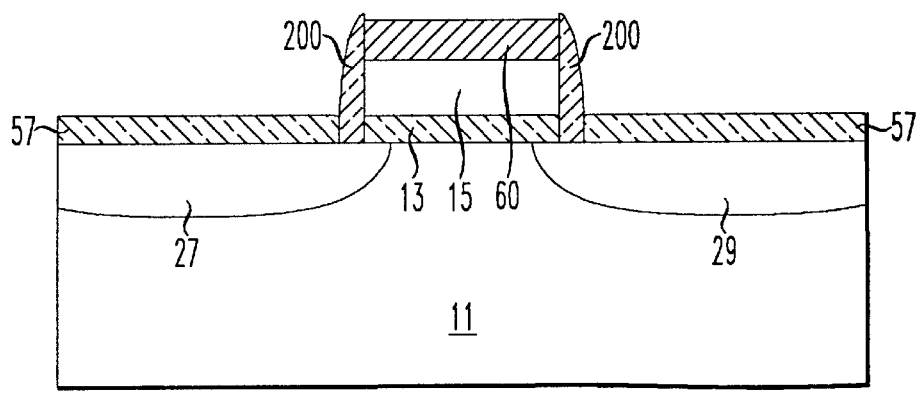

Turning to FIG. 13, refractory metal layer 59 is deposited on top of conductor 15 and thermal oxide 57. In FIG. 14, the structure has been exposed to a furnace treatment or a rapid thermal anneal process, thereby causing silicidation of polysilicon 15 by refractory metal 59. Silicidation cannot occur over source and drain region 27, 29 because of the presence of oxide 57. Next, the unsilicided refractory metal is removed, leaving only silicide 60 on top of conductor 15.

Figure 15:
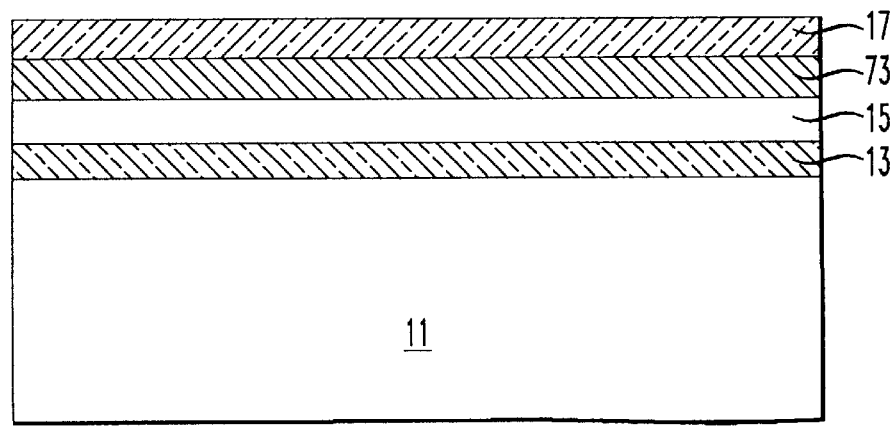

Should a silicided gate be desired with silicided source or drains, the procedure initially depicted in FIG. 15 may also be followed. This procedure permits the formation of a silicided gate having, for example, titanium silicide and source/drain regions having a different type of silicide, e.g., cobalt silicide. In FIG. 15, reference numeral 11 denotes a silicon substrate covered by an oxide layer 13 having a typical thickness of 150 Å, a polysilicon layer 15 having a typical thickness of 2000 Å, and a silicide layer 73 having a typical thickness of 1000 Å. Silicide layer 73 is formed by chemical vapor deposition or sputtering. Alternatively, a refractory metal may be deposited and reacted to form a silicide. Doped silicon dioxide layer 17 is deposited upon silicide layer 73. The oxide helps to prevent blistering or lifting of silicide 73 in subsequent processing.

Figure 16:
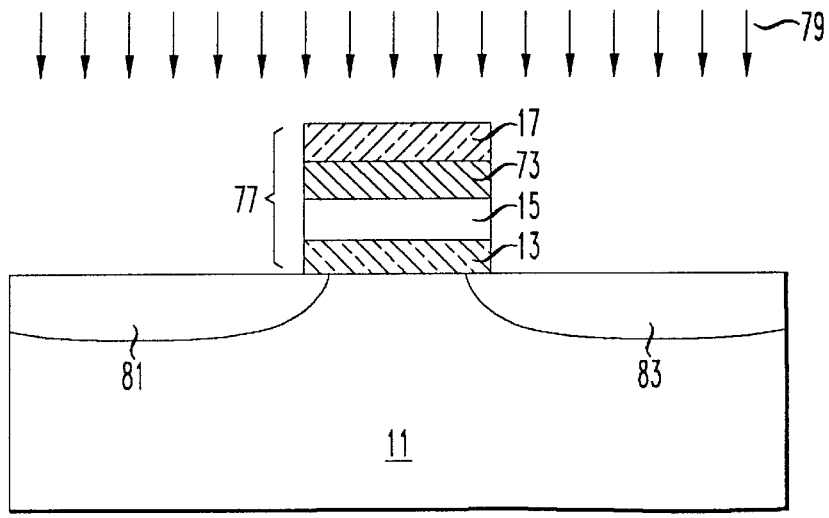

Turning to FIG. 16, gate stack 77 is formed utilizing the technique described above.

The presence of layer 17 upon gate stack 77 serves to protect the silicide 73 from ion implantation. If a spacer 200 is formed, it will protect the silicide in further processing, e.g., HF cleans where the silicide is titanium-silicide.

Figure 17:
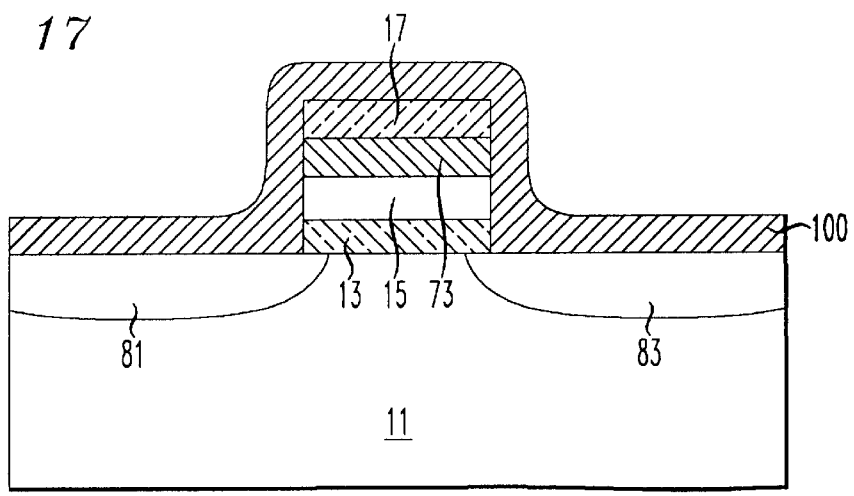
Figure 18:
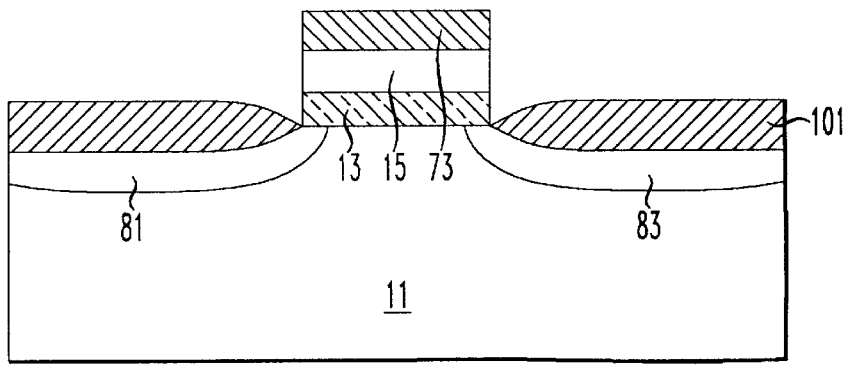
Figure 19:
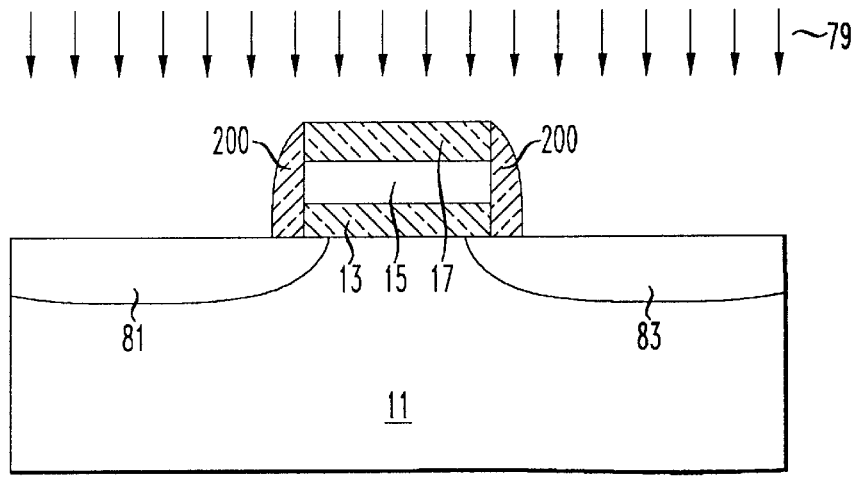
Figure 20:
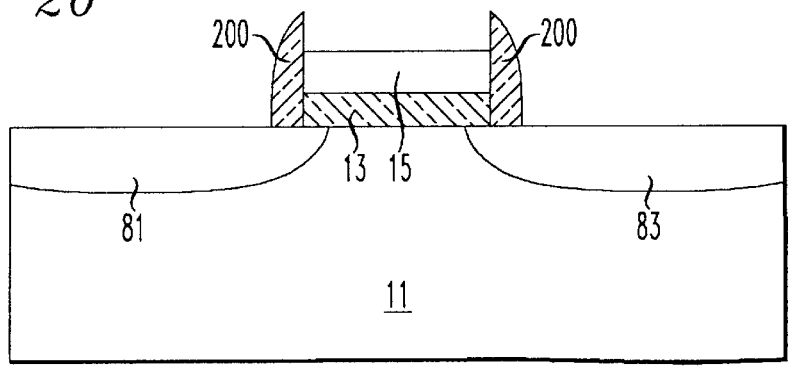

In FIG. 17, blanket layer 100 of refractory metal, which may be a different refractory metal than that utilized in silicide 73, is deposited. Refractory metal 100 is reacted by either rapid thermal annealing or furnace heating to form silicide 101 depicted in FIG. 18. Next, oxide 17 is removed. Subsequent processing may include the blanket deposition of a dielectric in the creation of contact openings to the silicided source and drains.

The present invention may also be employed to form a transistor without a silicided source or drain region. In FIG.

19, a gate having oxide 13, polysilicon conductor 15, and silicon oxide masking layer 17 is formed by the processes described previously. Spacers 200 are formed by the blanket deposition of a dielectric and subsequent anisotropic etching of the dielectric. Ion implantation with dopant species 79 is performed to form source and drain 81 and 83. The presence of layer 17 serves to protect the gate comprised of polysilicon 15 and 13 and the underlying portion of substrate 11 from channeling. Subsequently, layer 17 is removed by the processes described above, leaving a gate comprised of polysilicon 15 which may, for example, have a thickness of 2000 Å, and oxide 13 which may, for example, have a thickness of 90 Å.

An anti-reflective coating (ARC), typically of polysilicon, may be formed over the doped silicon dioxide layer, such as layer 17, and beneath the photoresist 21 (FIG. 1). Reflectivity of the underlying polysilicon 15, silicon dioxide 17 (or other materials as previously discussed) and ARC may be reduced by optimizing ARC and silicon dioxide thickness, thereby causing destructive interference of the light used to expose the photoresist. The ARC is removed during the gate etching process. The thickness of the silicon dioxide (sometimes termed a "hardmask") is chosen to both: i) minimize or reduce reflection of the light used to expose the photoresist and ii) minimize or reduce implant channeling during source/drain (or lightly doped drain) implantation.

Figure 21:
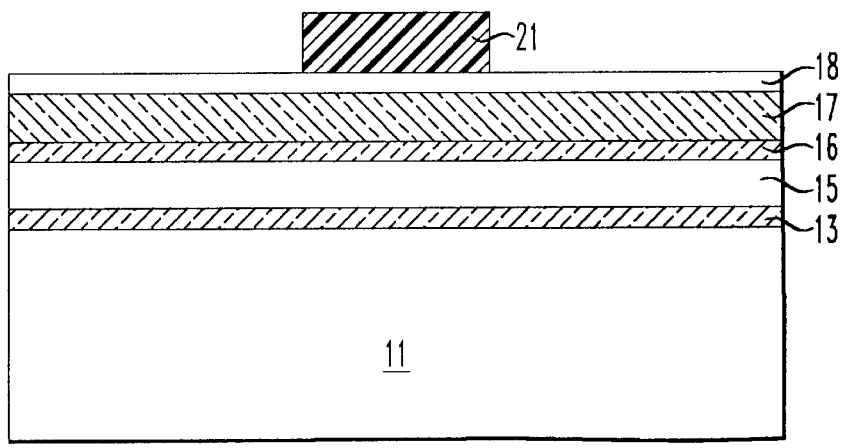

Illustratively, in FIG. 21, reference numeral 11 denotes a substrate which, as before, may be silicon, epitaxial silicon, polysilicon, amorphous silicon, or doped silicon. Reference numeral 13 denotes an oxide layer which may typically have a thickness between 30 Å and 300 Å.

Reference numeral 15 denotes a polysilicon layer which may or may not be doped. Typically, polysilicon layer 15 is heavily doped. The thickness of polysilicon layer 15 is desirably between 200 Å and 5000 Å. Reference numeral 16 denotes layer of undoped silicon dioxide. The thickness of layer 16 may be between 300 Å and 5000 Å. Reference numeral 17 denotes a doped silicon dioxide layer. Typically, the thickness of layer 17 may be between 2600 Å and 3200 Å. Layer 17 may be made from plasma-enhanced TEOS, doped boron and doped phosphorus. Reference numeral 18 denotes an anti-reflective coating (ARC). Layer 18 may desirably be made from polysilicon, having a thickness of approximately 45 Å.

Turning to FIG. 2, layers 18, 17, and 16 have been etched to define a hardmask. Photoresist 21 has been subsequently removed.

Figure 22:
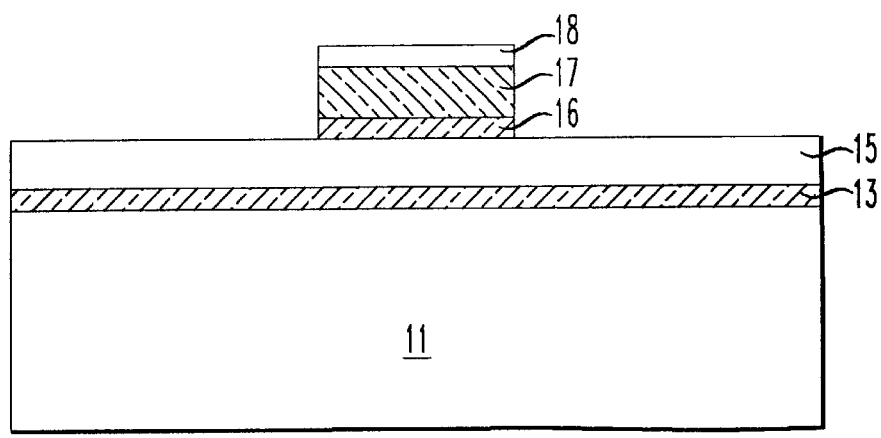
Figure 23:
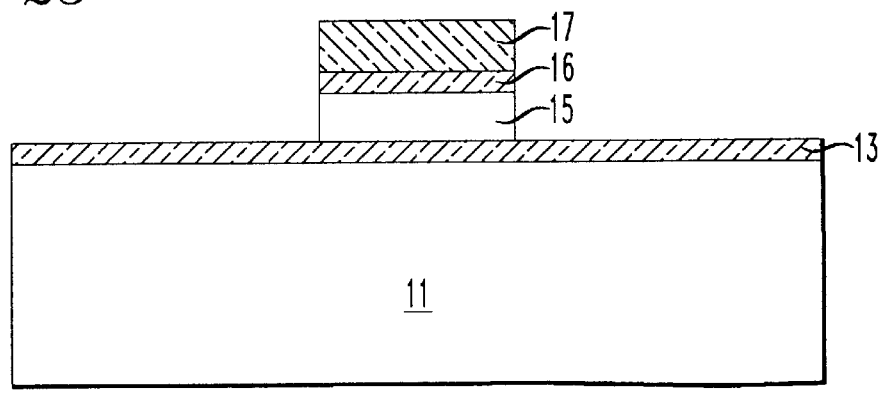

In FIG. 22, polysilicon layer 15 has been etched. The etch process stops on gate oxide 13. ARC 18 is typically eluded in the etching of polysilicon layer 15.

Figure 24:
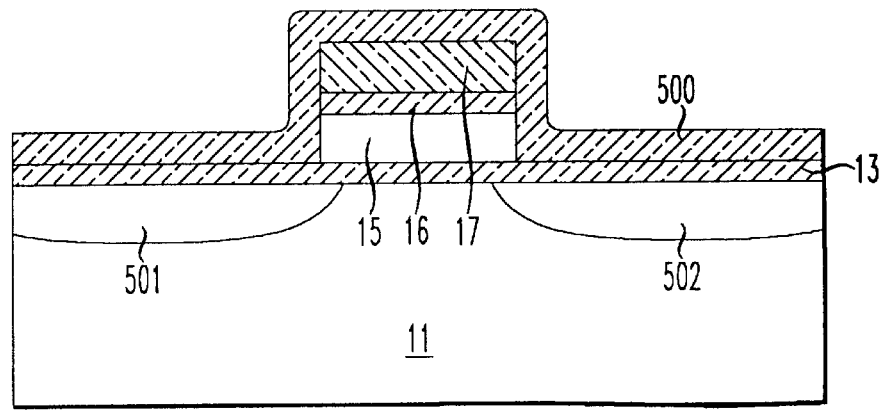

In FIG. 24, source and drain regions 501 and 502 may be formed by ion implantation. A layer of undoped silicon dioxide 500, typically formed from TEOS and having a thickness of approximately 180 Å is deposited to prevent subsequent out-diffusion of the implanted dopants.

Figure 25:
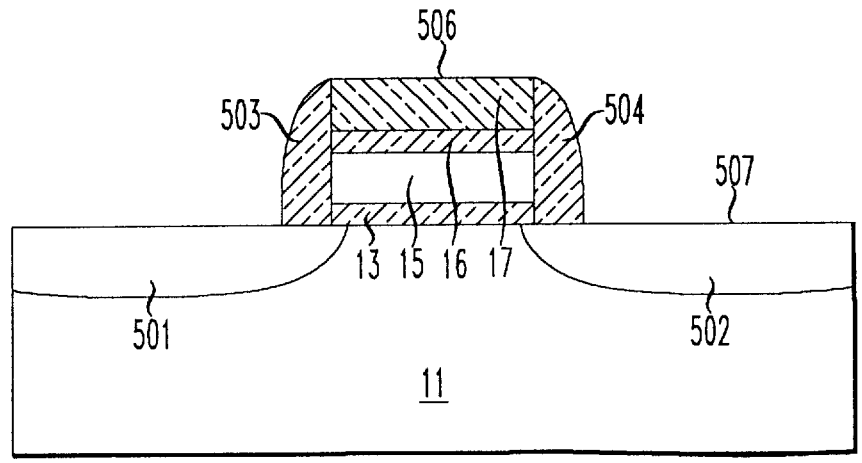

In FIG. 25, the implanted dopants are annealed. (In a twin-tub process, is subsequent implantation may be made in the opposite tub.) Next, an additional layer of undoped silicon dioxide is deposited and subsequently etched to form spacers 503 and 504. The etching process which defines the spacers 503 and 504 may also expose the upper surface 506 of BPTEOS 17 and the upper surface 507 of substrate 11.

Figure 26:
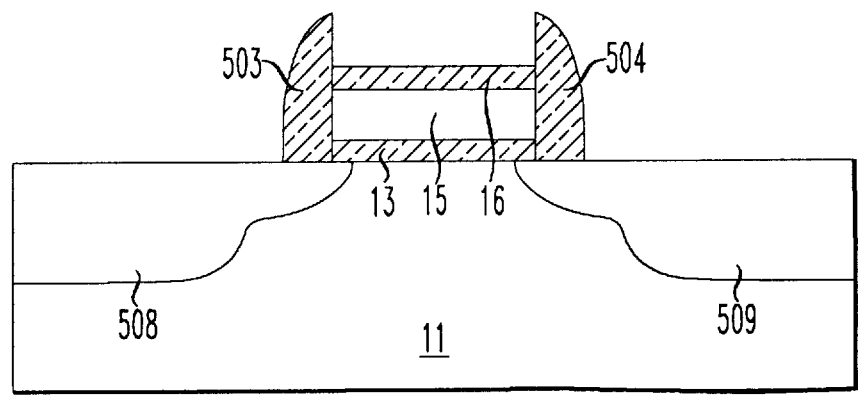

In FIG. 26, a second implant has been performed to define lightly doped drain structures 508 and 509. The previously-described etching process is utilized to remove doped layer 17.

If desired, the anti-reflective coating (ARC) may be utilized in conjunction with the previously-mentioned processes for forming various silicides on the source and drain and/or gate. (Of course, silicides formed upon the gate, would be formed beneath layer 16.)

The BPTEOS hardmask is removed using the previously-described selective wet etch of ammonium peroxide/hydrogen peroxide at approximately 83° C. which does not etch the undoped TEOS spacers or the field oxide regions. By removing the hardmask prior to dielectric 1 deposition, the gate stack height is reduced, thereby improving first level metal coverage. During the anneal of the lightly doped drain portion, the thin (180 Å) undoped TEOS layer helps to prevent flow and out-diffusion of the dopants from the hardmask. The process provides superior linewidth control thereby maximizing drive current of transistors and improving circuit performance.

A further advantage of the hardmask describes herein is that significant loading effects are not observed in single wafer etchers, possibly, because etchant species are not consumed by photoresist.

We claim:

1. A method of semiconductor integrated circuit fabrication comprising:

forming a dielectric layer upon a substrate;

forming a conductive layer upon said dielectric layer;

forming a material layer overlying said conductive layer;

forming an anti-reflective coating upon said material layer;

forming a patterned resist upon said antireflective coating by exposing said resist to light;

said anti-reflective coating having a thickness chosen in conjunction with a thickness of said material layer so as to reduce the total reflectivity of said light from said anti-reflective coating, said material and conductive layers;

etching said anti-reflective coating;

at least partially etching said material layer to thereby form a raised feature;

removing said resist; and then using said raised feature as a mask, anistropically etching said conductive layer and said dielectric layer, thereby forming a gate;

forming source and drain regions; and then removing said mask;

wherein the material layer is a silicon oxide layer whose doping increases from bottom to top.

2. The method of claim 1 in which said material layer is formed from the group consisting of BPSG and PSG.

3. The method of claim 1 further including the steps of:

prior to removal of said material layer, blanket depositing a refractory metal upon said material layer and upon said source and drain;

heating said refractory metal to form a silicide upon said source and drain and not upon said gate.

4. The method of claim 1 further including the steps of:

forming a protective layer over said source and drain;

exposing said conductive layer of said gate by removing said material layer;

depositing a refractory metal upon said conductive layer and upon said protective layer;

heating said refractory metal to form silicide upon said gate and not upon said source and drain.

5. The method of claim 1 further including the steps, prior to removal of said material layer, of:

blanket depositing a refractory metal upon said gate and source and drain region;

reacting said refractory metal to form a silicide upon said source and drain region and not upon said gate.

6. The method of claim 1, further including the steps of:

blanket depositing a refractory metal upon said gate and said source and drain region.

* * * * *